United States Patent
Jansen et al.

(10) Patent No.: US 10,164,138 B2
(45) Date of Patent: Dec. 25, 2018

(54) PHOTOVOLTAIC MODULE

(71) Applicant: Stichting Energieonderzoek Centrum Nederland, Petten (NL)

(72) Inventors: Markus Johan Jansen, Petten (NL); Johannes Adrianus Maria van Roosmalen, Petten (NL); Evert Eugène Bende, Petten (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 1 day.

(21) Appl. No.: 15/300,290

(22) PCT Filed: Apr. 1, 2015

(86) PCT No.: PCT/EP2015/057212
§ 371 (c)(1),
(2) Date: Sep. 29, 2016

(87) PCT Pub. No.: WO2015/150471
PCT Pub. Date: Oct. 8, 2015

(65) Prior Publication Data
US 2017/0186902 A1    Jun. 29, 2017

(30) Foreign Application Priority Data

Apr. 2, 2014  (NL) ..................... 2012557

(51) Int. Cl.
*H01L 31/05* (2014.01)
*H01L 31/02* (2006.01)
*H01L 31/044* (2014.01)

(52) U.S. Cl.
CPC ...... *H01L 31/0516* (2013.01); *H01L 31/0201* (2013.01); *H01L 31/02013* (2013.01);
(Continued)

(58) Field of Classification Search
CPC ............... H01L 31/0516; H01L 31/044; H01L 31/0201; H01L 31/02013
(Continued)

(56) References Cited

U.S. PATENT DOCUMENTS

2010/0012172 A1*  1/2010  Meakin ................. H01L 31/048
                                                        136/251
2012/0222728 A1*  9/2012  Nakanishi ........... H01L 31/0516
                                                        136/251
(Continued)

FOREIGN PATENT DOCUMENTS

CN    102496644 A    6/2012
WO    89/05521 A1    6/1989
(Continued)

*Primary Examiner* — Jayne L Mershon
(74) *Attorney, Agent, or Firm* — N.V. Nederlandsch Octrooibureau; Lindsey A. Auerbach; Catherine A. Shultz

(57) ABSTRACT

Photovoltaic module with a negative terminal (5) and a positive terminal (6), and a parallel connection (3, 4) of m sub-modules (2) connected to the negative and the positive terminal (5, 6) of the photovoltaic module (1). Each of the m sub-modules (2) has a string of n series-connected back-contact cells (9), wherein the n cells (9) of each sub-module (2) are arranged in an array. The parallel connection (3, 4) and connections (8) for each string of n series-connected back contact cells (9) are provided in a back conductive sheet, and the back conductive sheet comprises designated areas (7) for the parallel connection (3, 4), corresponding to edge parts of each corresponding sub-module (2).

18 Claims, 9 Drawing Sheets

(52) U.S. Cl.
CPC ............ *H01L 31/044* (2014.12); *Y02B 10/12* (2013.01); *Y02B 10/14* (2013.01); *Y02E 10/50* (2013.01)

(58) Field of Classification Search
USPC ........................................................ 136/251
See application file for complete search history.

(56) References Cited

U.S. PATENT DOCUMENTS

2014/0060610 A1* 3/2014 Moslehi .......... H01L 31/022441
 136/244
2014/0166098 A1* 6/2014 Kian ....................... C23C 18/54
 136/256

FOREIGN PATENT DOCUMENTS

WO   2009/134939 A2   11/2009
WO   2010/135801 A1   12/2010

* cited by examiner

PHOTOVOLTAIC MODULE

FIELD OF THE INVENTION

The present invention relates to a photovoltaic module comprising a negative terminal and a positive terminal.

PRIOR ART

International patent publication WO2009/134939 discloses photovoltaic modules manufactured using monolithic module assembly techniques. An embodiment is disclosed wherein the cells of the photovoltaic module are arranged in a 6×10 array and are interconnected by a non-linear circuit path.

International patent publication WO2010/135801 discloses a photovoltaic module string arrangement having a shading protection implemented. Conductors and bypass diodes are provided on a perimeter margin of the photovoltaic module, and are connected to strings of cells.

A further known photovoltaic module, available under the trade name Sliver from Transform Solar Pty Ltd, comprises a plurality of small rectangular cells, of which many are connected in parallel to improve the shade performance, without using bypass diodes. The parallel and serial connections between the cells are obtained by interconnecting bussing positioned between the cells, thus using front area surface reducing the overall efficiency of the module.

International patent publication WO 89/05521 discloses a photovoltaic module, see e.g. FIGS. 1, 3 and 4, having parallel connections in the form of bus bars or strips of copper, interconnecting sub-modules, which in turn each comprise series connected solar cells. The solar cells within a sub-module are mutually connected using e.g. a copper string or ribbon.

SUMMARY OF THE INVENTION

The present invention seeks to provide an improved photovoltaic module, especially with regard to (partial) shading performance.

According to the present invention, a photovoltaic module according to the preamble defined above is provided, having a parallel connection of m sub-modules connected to the negative and the positive terminal of the photovoltaic module, wherein each of the m sub-modules comprises a string of n series-connected back-contact cells, wherein the n cells of each sub-module are arranged in an array, the parallel connection and connections for each string of n series-connected back contact cells are provided in a back conductive sheet (e.g. a conductive foil), and the back conductive sheet comprises designated areas for the parallel connection, corresponding (at least) to edge parts of each corresponding sub-module. The back-contact cells can be various types of cells for which the connections are all available at the back side of the cells, including but not limited to: metal wrap through (MWT), emitter wrap through (EWT), interdigitated back contact (IBC) cells, and cells where the side edges of cells are used to connect front side conductors to the level of the back side of the cell. The present invention embodiments allow to (partially) provide interconnections between cells on the back conductive sheet of the photovoltaic module, which increases the efficiency both in operation and during manufacturing.

SHORT DESCRIPTION OF DRAWINGS

The present invention will be discussed in more detail below, using a number of exemplary embodiments, with reference to the attached drawings, in which FIG. 1 shows an embodiment of a (back side of a) photovoltaic module according to an embodiment of the present invention;

FIG. 8b shows a schematic view of a sub-module using the back conductive sheet of FIG. 8a;

FIG. 9b shows a schematic plan view of a sub-module of the PV module embodiment of FIG. 9a;

FIG. 9c and 9d show schematic plan views of further alternative embodiments to the PV module of FIG. 9a;

DETAILED DESCRIPTION OF EXEMPLARY EMBODIMENTS

Figure 1:
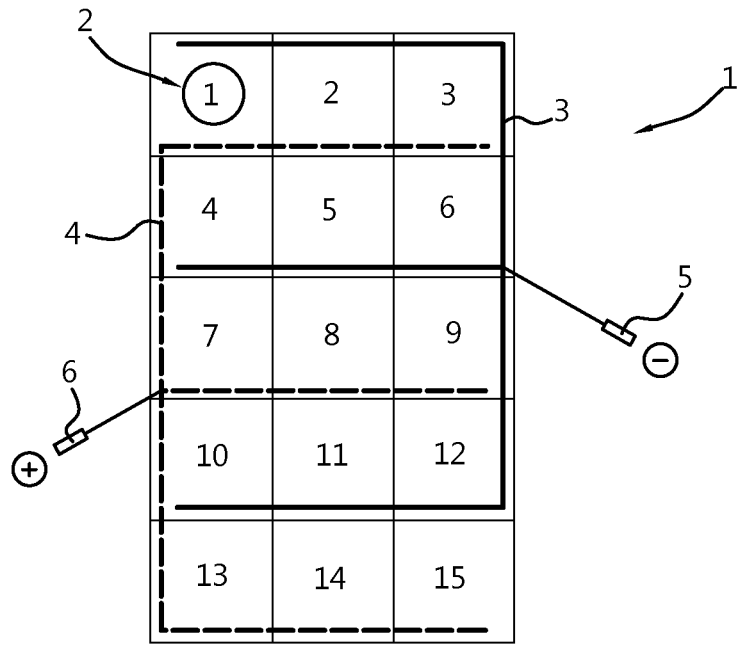

The present invention embodiments aim to provide improved photovoltaic modules, exploiting the specific features and capabilities when using back-contact cells, or more general photovoltaic modules based on conductive back sheet technology. FIG. 1 shows an embodiment of a (back side of a) photovoltaic module 1 according to an embodiment of the present invention, comprising an array of 15 sub-modules 2 in a 3×5 array (numbered from 1 to 15). In more generic terms a parallel connection 3, 4 (e.g. implemented as bussing leads) is provided of m sub-modules 2 connected to the negative and the positive terminal 5, 6. A negative terminal (or adapter) 5 is provided in contact with a parallel connection 3, and a positive terminal (or adapter) 6 is provided in contact with a parallel connection 4. It is noted that this 3×5 array of the present invention PV module 1 may be of a similar size as customary PV panels having usually a combination of 6×10 PV cells.

In the present invention embodiments, the sub-module 2 comprises a string of series-connected back-contact cells 9 (see also FIG. 3 below). The n cells 9 of each sub-module 2 are arranged in an array, and the parallel connection 3, 4 and connections 8 for each string of n series-connected back-contact cells 9 are provided in a back conductive sheet, and the back conductive sheet comprises designated areas 7 for the parallel connection 3, 4, corresponding at least to edge parts of each corresponding sub-module 2. A possible embodiment of the designated areas 7 is indicated in the schematic view of FIG. 2. The use of the designated areas 7 in the back conductive sheet allow to (partially) provide interconnections between cells 9 on the back conductive sheet of the photovoltaic module 1, which increases the efficiency both in operation and during manufacturing. This can be implemented, as an isolating layer is present between the back sides of the cells 9 and the back conductive sheet (with the exception of the needed positive and negative connections), e.g. provided by the encapsulant. Furthermore, an isolating and protecting layer may be present on top of the back conductive sheet, e.g. in the form of an organic surface protection layer (OSP), a zinc chromate layer, etc.

In a further embodiment, each sub-module 2 has a substantially square footprint (or total surface area), or even an exact square footprint. The more square the sub-module 2 area is, the better the shade tolerance of the photovoltaic module 1 for elongated shades of which the direction of the elongation is randomly distributed over 360 degrees.

The combination of the above features allows to provide a photovoltaic module 1 needing no bypass diodes as in prior art PV modules, yet providing an excellent performance under (partial) shading conditions. It is estimated that the more square the sub-module 2 area is, the better the shade tolerance of the photovoltaic module 1.

According to the present invention embodiments, a photovoltaic module 1 is provided with back-contacted cells (or mini-cells) 9 based on conductive foil technology where the mini-cells 9 are series connected into strings and where the strings are connected in parallel. This results in a shade tolerant photovoltaic module 1 with a nice look and feel, very suitable for the 'Building Integrated PV/Building Applied PV' (BIPV/BAPV) market. These modules 1 as mentioned do not require bypass diodes which saves cost and obviates the need for bypass diode boxes and therefore brings about more freedom for in-roof applications. Moreover, the panel architecture is modular enabling a huge amount of different module shapes (L-shape, U-shape, O-shape), while the output voltage can be standardized, e.g. 32 V, allowing development of DC-DC converter/micro-inverters optimized for this voltage. Also, as the strings in the invention embodiments have a meandering shape occupying a square area, the PV module is in general less vulnerable to elongated shade patterns, with arbitrary direction of the elongation.

In an alternative arrangement, a photovoltaic panel (or photovoltaic module 1) is provided comprising back contacted cells 9 mounted on a patterned conductive foil, where the pattern of the foil is such that sets of solar cells 9 are series interconnected into strings (forming sub-modules 2) by a conductive foil sub-pattern (connections 8, see description of FIG. 3 below) and where these strings (or sub-modules 2) are connected in parallel by a conductive-foil main pattern. The strings (or series-connected cells 9) have a meandering shape and each string (forming a sub-module 2) occupies a square area. The main conductive foil pattern has an interdigitated shape, i.e. the conducting paths of the parallel connections 3, 4 are partly running in parallel.

In a further alternative arrangement, a photovoltaic panel (or photovoltaic module 1) is provided comprising back contacted cells 9 mounted on a conductive foil, with a modular configuration, where each modular component (or sub-module 2) comprises a series interconnection of multiple cells (i.e. a string of cells 9) where the terminals of the string are connected to two of at least two conductive foil leads (as part of the parallel connections 3, 4). The string has a meandering shape and the string occupies a square area. Each modular component 2 can be connected to at least one adjacent modular component 2, thereby forming a parallel connection 3, 4; where the parallel conductors 3, 4 are incorporated in the foil and are located underneath a subset of photovoltaic cells 9.

Figure 2:
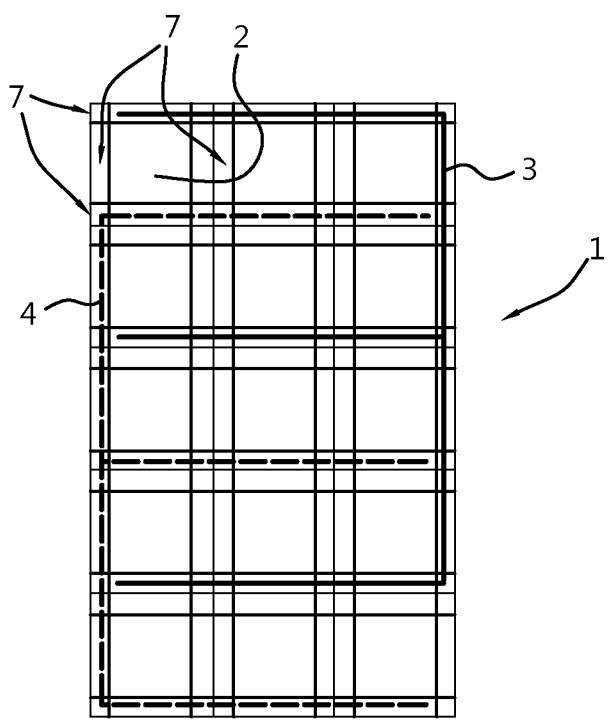
FIG. 2 shows a diagram of the back side of the photovoltaic module of FIG. 1 with designated parallel connection areas.
Figure 7:
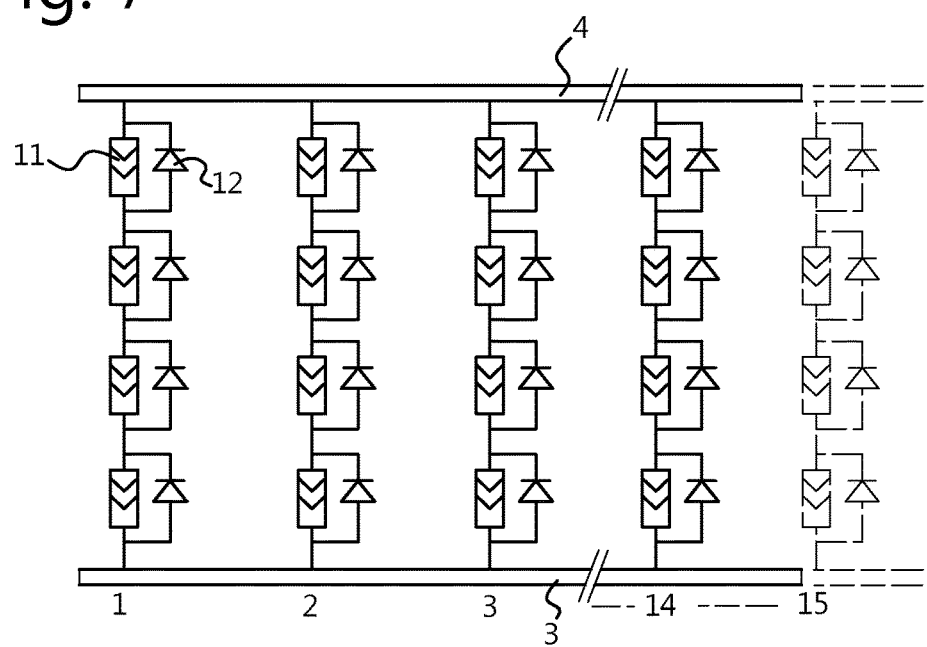
FIG. 7 shows a schematic electrical diagram of a further alternative embodiment of the present invention photovoltaic module.

In a group of embodiments, an example of which is shown in the schematic view of FIG. 2, the parallel connection 3, 4 and connections 8 for each string of n series-connected back contact cells 9 are provided in a single back conductive sheet. Using the single back sheet (or even a double foil back sheet, see below with reference to FIG. 7), and back-contact cells 9, it is possible to have as much as possible of the front area of the photovoltaic module 2 to be productive, without shading caused by interconnections at the front side of the cells 9.

Figure 8A:
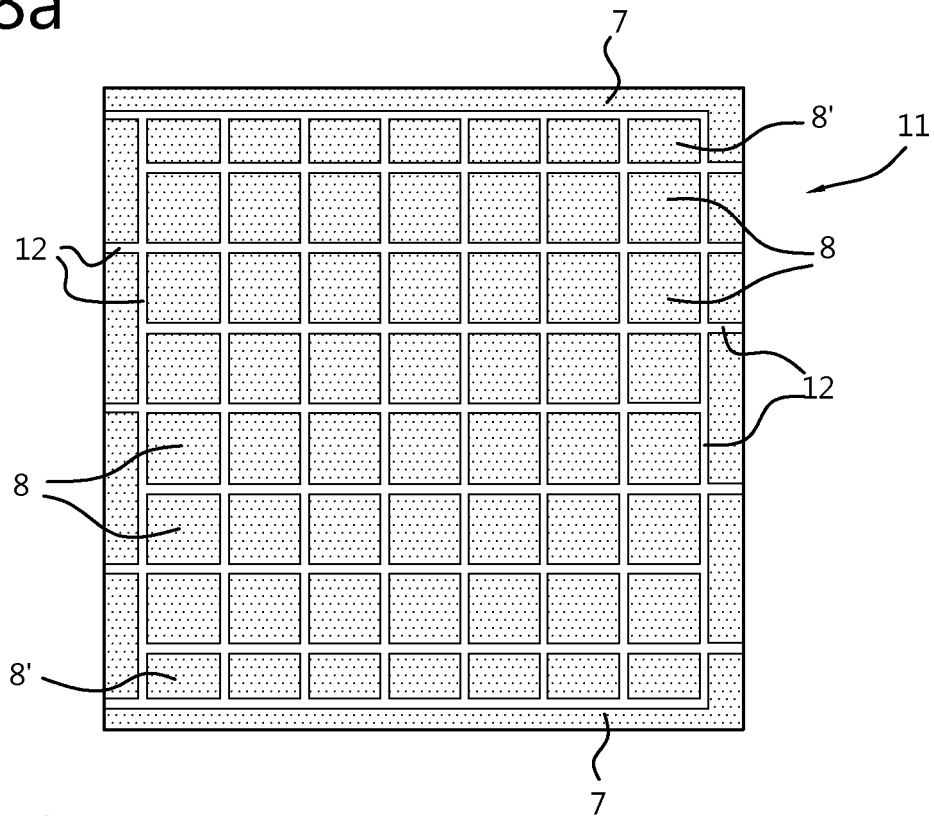
FIG. 8a shows a schematic view of a back conductive sheet as used in an embodiment of the present invention.
Figure 8B:
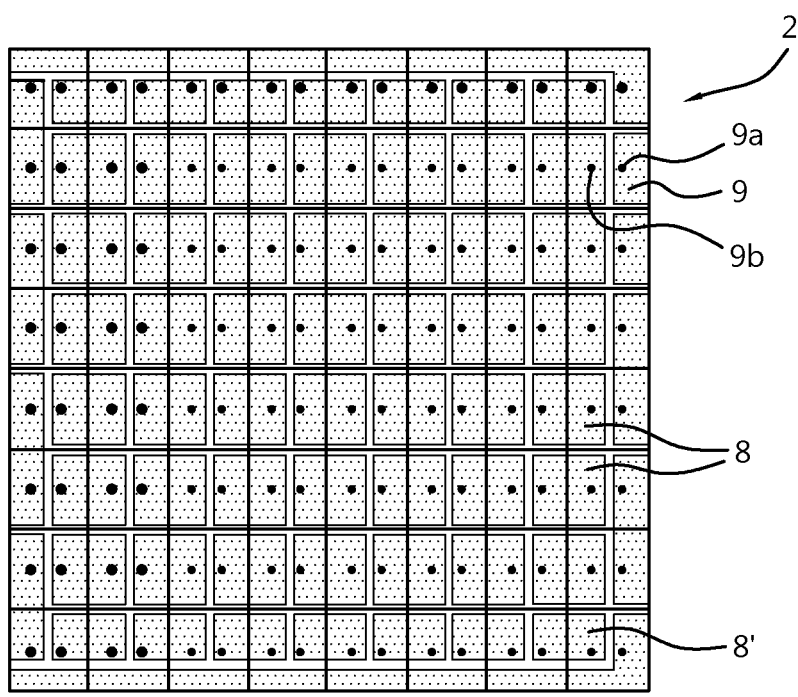

In FIG. 2, again, the parallel connections 3, 4 are shown as interdigitated conductors. In a further embodiment, the back conductive sheet is a single back conductive sheet 11. Using a proper lay-out, the parallel connections 3, 4 between the sub-modules 2 do not interfere with the (series) connections 8 of the cells 9 forming the sub-module 2. Such a single back conductive sheet 11 is shown in more detail in the schematic view of FIG. 8a. The single back conductive sheet 11 comprises the connections 8 using isolation scribes 12, which are e.g. formed in the single back conductive sheet 11 using etching or other scribe line techniques. In FIG. 8b, the entire sub-module 2 is shown, including the square shaped cells 9 with each a positive and negative back contact 9a, 9b. In FIG. 8a it is clear that the majority of the connections 8 are also square, similar to the cells 9. However, in this embodiment, designated areas 7 are again provided at the edges of the sub-module 2, to allow space for the parallel connections 3, 4. This is possible by simply making some of the connections 8 a bit smaller (indicated as connections 8') ensuring connection to the positive and negative back contacts 9a, 9b is still possible.

Figure 9A:
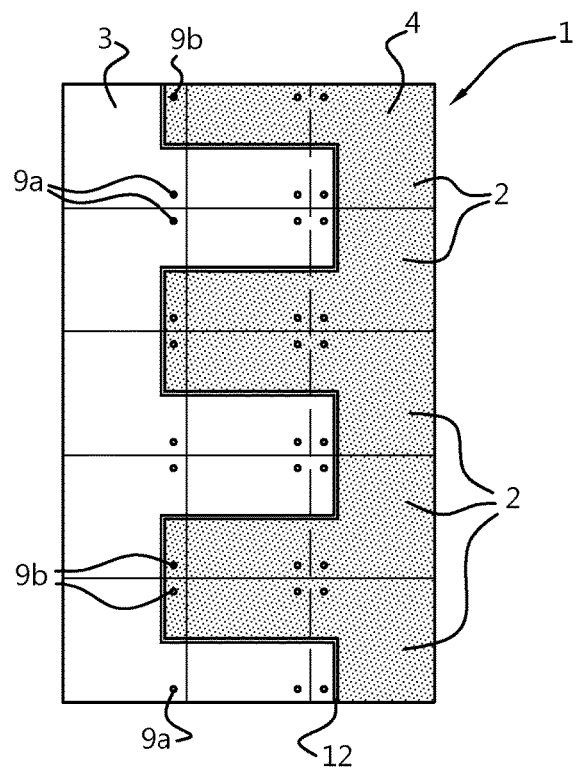
FIG. 9a shows a schematic plan view of a PV module according to a further embodiment of the present invention.

A further number of alternative embodiments of the present invention PV-module 1 are shown schematically in FIGS. 9a-d, wherein the series connections 8 of the cells are provided in island shaped parts of the single back conductive sheet 11. FIG. 9a shows a plan view of the entire PV module 1, having a 3×5 configuration of sub-modules 2. A single back conductive sheet 11 is provided, which is divided in a positive section and negative section forming the respective parallel connections 3, 4, separated and isolated by an isolation scribe 12. The division is such that each sub-module 2 can be connected to both the positive section (parallel connection 3) and negative section (parallel connection 4).

Figure 9B:
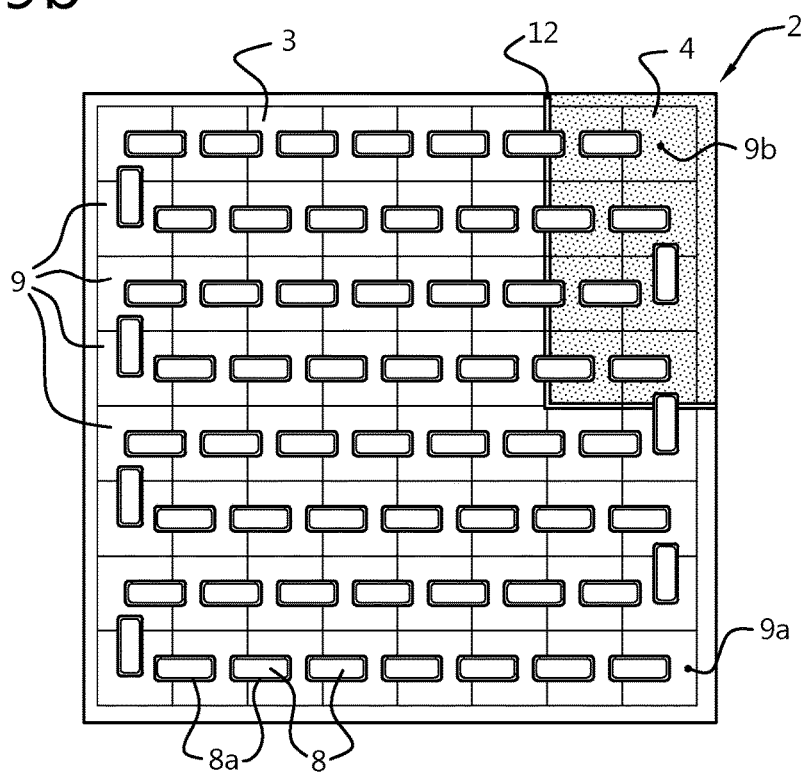

FIG. 9b shows a plan view of the top left sub-module part of the back-conductive sheet, showing the 8×8 cells 9 forming the sub-module 2, and the respective series connections 8 thereof. Also shown is the part of the positive section 3 and negative section 4 overlying this specific sub-module 2. Insulated wiring islands 8a are provided in the single back conductive sheet 11 allowing the series connection 8 to be formed in the single conductive back sheet 11 as well. This can be provided for each of the sub-modules 2 of the PV-module 1 as shown in FIG. 9a.

In this group of embodiments, it is thus possible to provide sufficient insulated wiring islands 8a in the single back conductive sheet 11 to form a local string wiring chain using the series connections 8. The remainder of the single back conductive sheet 11 outside of the wiring islands 8a is available to provide for the parallel connections 3, 4. The sub-module 2 can then be connected to the parallel connections 3, 4 using the cell terminals 9a, 9b at the first and last cell 9, respectively, of the sub-module's string, as shown in FIG. 9b.

Figure 9C:
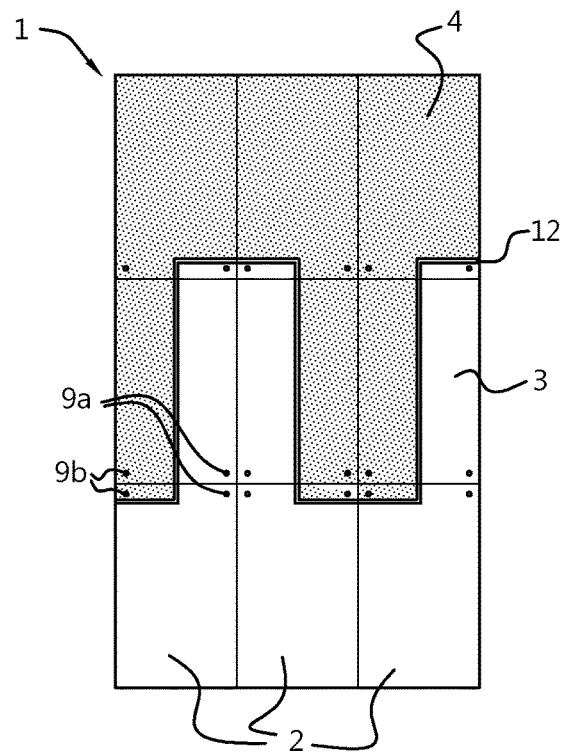
Figure 9D:
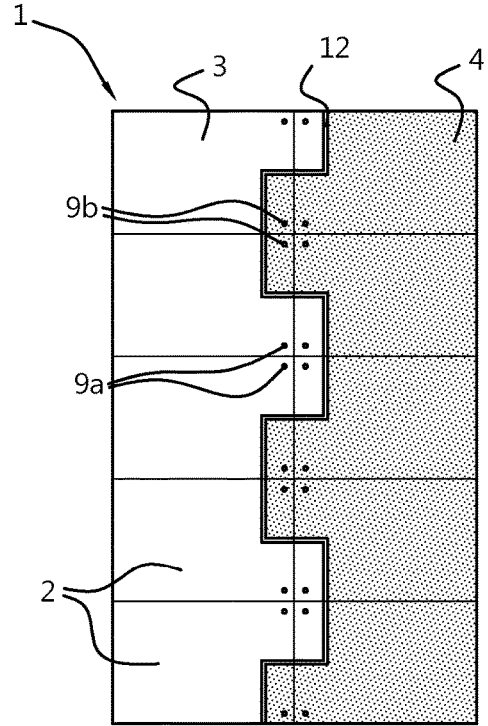

FIG. 9c and FIG. 9d show further alternative arrangements of the positive and negative sections 3, 4 of the single back conductive sheet 11 for a 3×3 sub-module (FIG. 9c) and a 2×5 sub-module (FIG. 9d) configuration of the PV module 1.

In the embodiments of FIG. 9a-9d, the positive and negative terminals 9a, 9b of each sub-module 2 have been provided at extremities of opposite corners of a sub-module (the 'dots' 9a, 9b in the corners of the sub-modules 2 in the embodiments as shown in FIGS. 9a, 9c and 9d). In further embodiments, the sub-modules 2 can be designed by proper selection and orientation of the string of n series-connected back-contact cells 9 to have their respective positive and negative terminals 9a, 9b grouped at a relatively short distance to each other, e.g. within half of the length dimension of the sub-module 2. The grouped positive and negative terminals 9a, 9b can then be positioned e.g. in the middle part of each sub-module 2, or at a corner of each sub-module 2.

In an embodiment, a wafer is diced into sixteen (mini-) cells 9, which are connected in series to form a sub-module 2. When the grouped positive and negative terminals 9a, 9b are in a corner of a sub-module 2, it is possible to use specific foil string routes 2A, 2B, 2C and 2D, which when properly combined can be grouped as a four unit module basic block for an effective lay-out of the back conductive sheet 11, wherein the positive and negative terminals 9a, 9b of a basic block are either accessible to the left or right, and each with two possible orientations of positive terminal 9a and negative terminal 9b. This is shown schematically in the embodiment shown in FIG. 10, which again shows the partitioning of the parallel connections 3, 4 in designated areas 7 which cover at least the edge parts of each corresponding sub-module 2, wherein the parallel connections 3, 4 are separated by a scribe line 12. The six by ten sub-module 2 configuration of the PV module 1 has three by four basic blocks (A-B-A-B and C-D-C-D), indicated by the dashed lines, each with the specific configuration of negative and positive terminal 9a, 9b.

Figure 10:
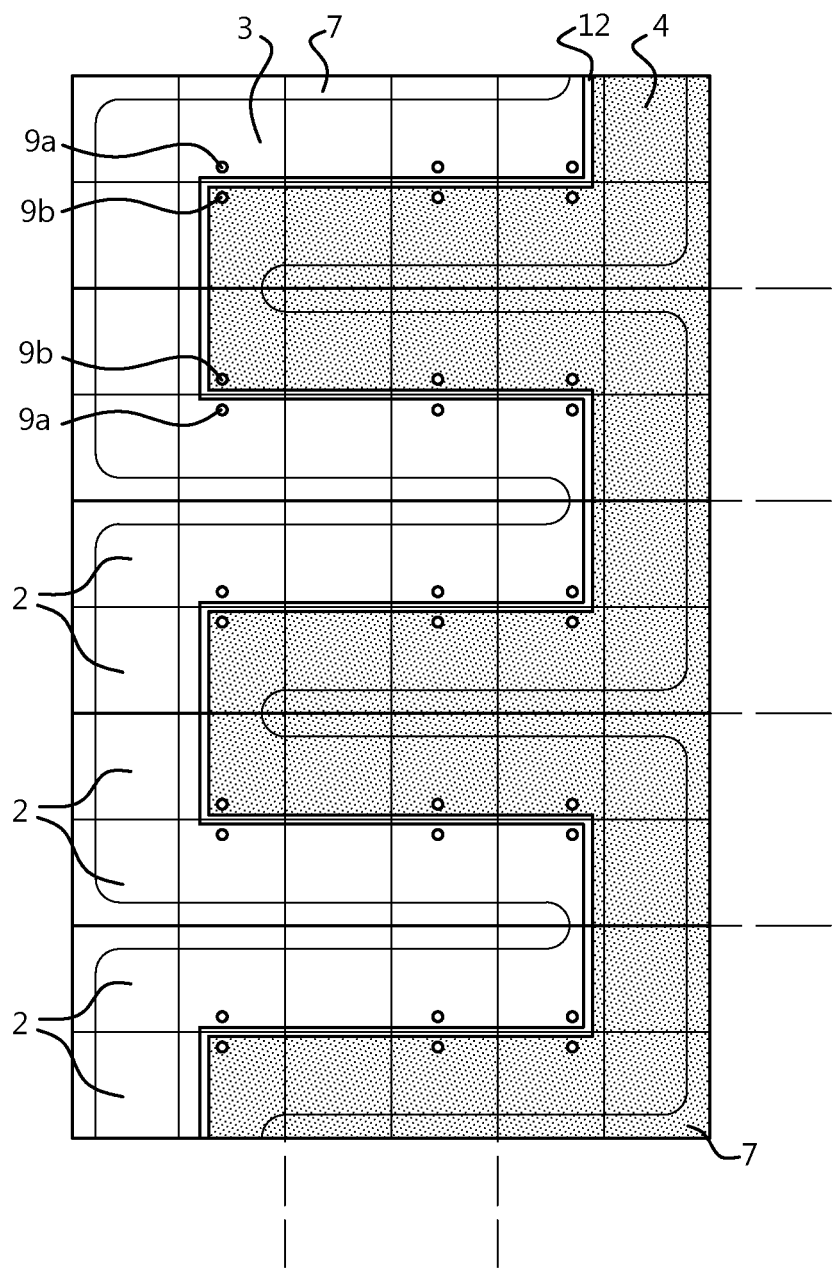
FIG. 10 shows a schematic plan view of a PV module according to an even further embodiment of the present invention.
Figure 11:
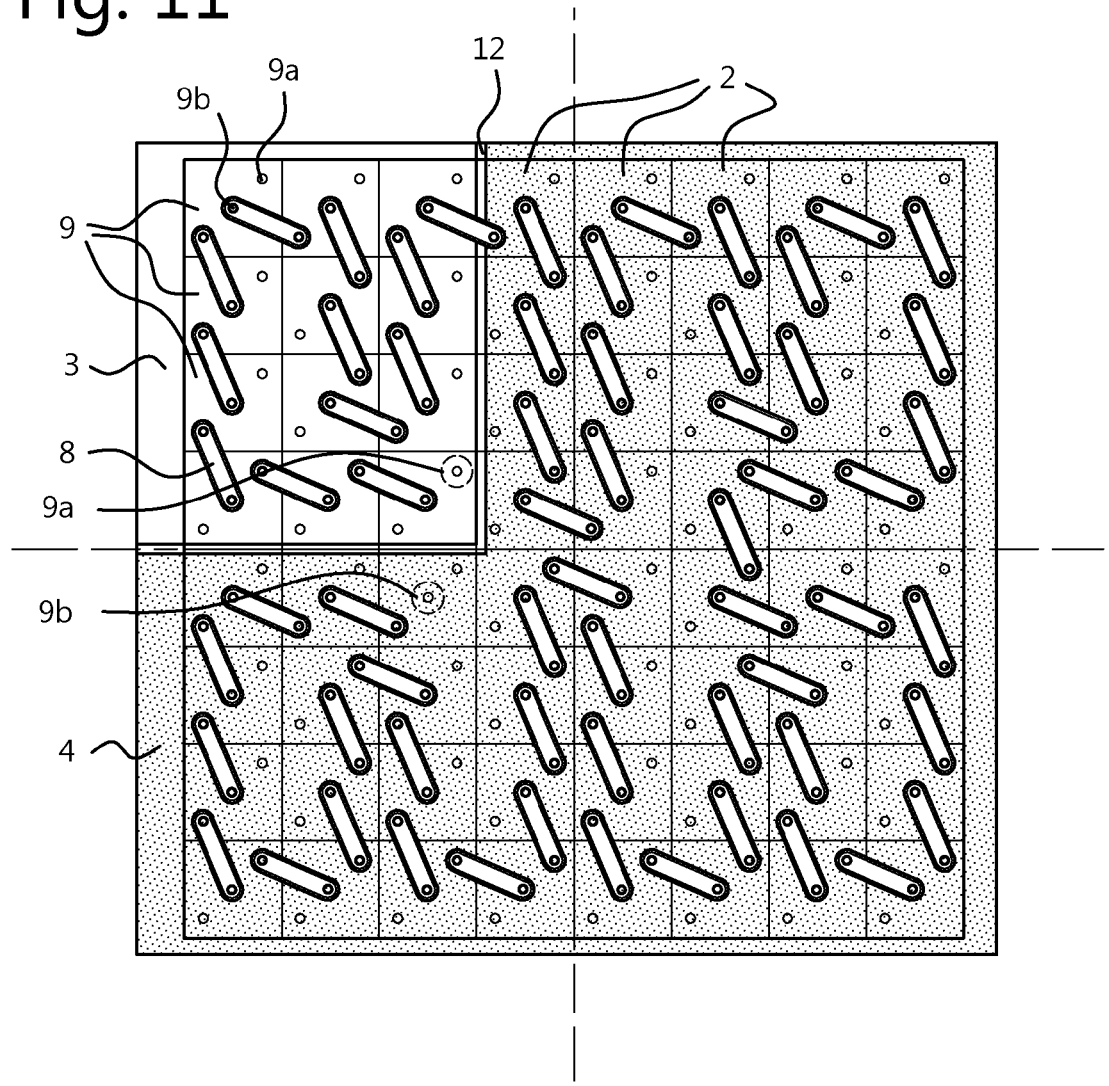
FIG. 11 shows a detailed view of a series connection of a basic block having four sub-modules of the PV module of FIG. 10.

FIG. 11 shows in detail the structure of four sub-modules 2 (indicated by dashed lines) each having a specific string route (in this case two times string route 2C and two times string route 2D), which is the second row, first column basic block of the embodiment shown in FIG. 10. The series connection of the cells 9 is again provided by connections 8 provided in islands in the back conductive sheet 11. In the configuration shown, four string patterns are given (C-D-C-D), leaving one positive terminal 9a and one negative terminal 9b which are connected, respectively to the parallel connections 3, 4. The connections 8 in this case are simple straight connection strips, as part of the back conductive sheet 11, between positive and negative neighboring cells 9.

In the more detailed view of FIG. 11 it is shown that each cell 9 is provided with three terminals 9a, 9b in a diagonal pattern, the middle one being of an opposite polarity of the outer ones. This allows to provide a very efficient string route for each sub-module 2, e.g. as shown in the embodiment of FIG. 11. Also, it allows to keep the footprint or metallization pattern before and after dicing a wafer into cells 9 equal throughout an entire PV module 1. Also, each diced wafer (sixteen cells 9) can be placed on the back conductive sheet 11 in the same orientation (and right next to another set of sixteen cells 9).

Figure 12:
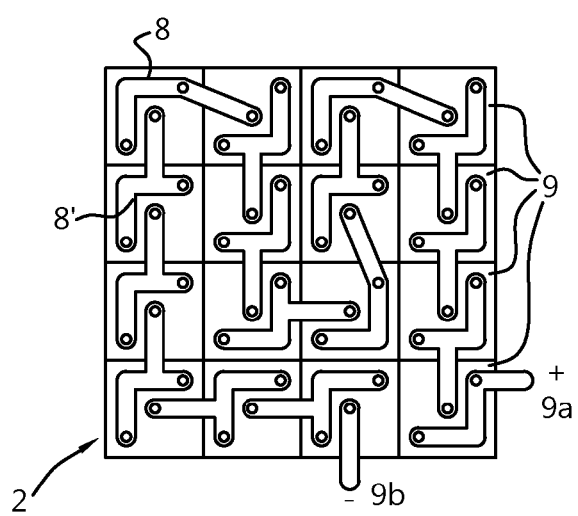
FIG. 12 shows an alternative embodiment of a series connection of a sub-module.

In FIG. 12, a further possible embodiment is shown of a sub-module 2 having four by four cells 9, wherein the series connections 8, 8' are provided as concave shaped connections 8, 8' in two different variants (bent strip 8 or fork shaped connection 8'). This results in a very efficient string connection ending with a positive and negative terminal 9a, 9b available at a lower right corner of this type of string route 2A. In general, a convex shape is used for the series connections 8 (see e.g. embodiment of FIG. 11), wherein the entire area between the connected terminals is formed in the conductive back sheet 11, whereas the concave shaped connections 8 comprise a part of the conductive back sheet 11 which is not part of the electrically conductive path between the connected terminals.

The specific structure of four sub-modules 2 forming a basic block is also very effective and efficient for connecting by-pass diodes (where needed, in parallel to a series connection of cells 9). It even enables to include one by-pass diode for every string of sixteen cells 9, using the respective positive and negative terminals 9a, 9b. This has the further advantage that the tracks to the by-pass diodes are kept as short as possible. Also it allows to use different types of by-pass diodes, such as case type diodes, wafer type with back contact, or wafer type with front and rear contact.

Figure 3:
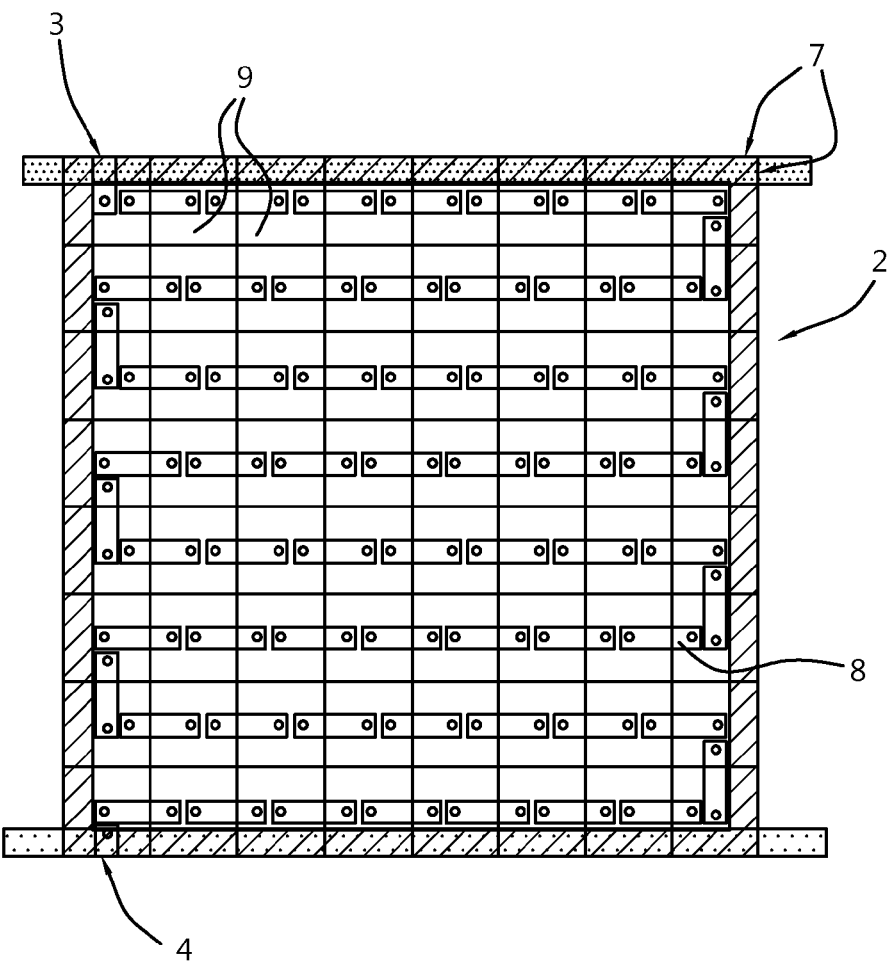
FIG. 3 shows a schematic view of a sub-module according to a further embodiment of the present invention.
Figure 4A:
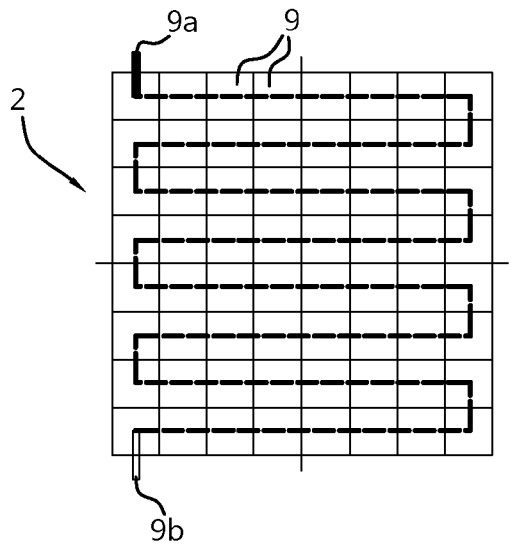
FIGS. 4a and 4b show a schematic view of two alternative connection embodiments for the sub-module.
Figure 4B:
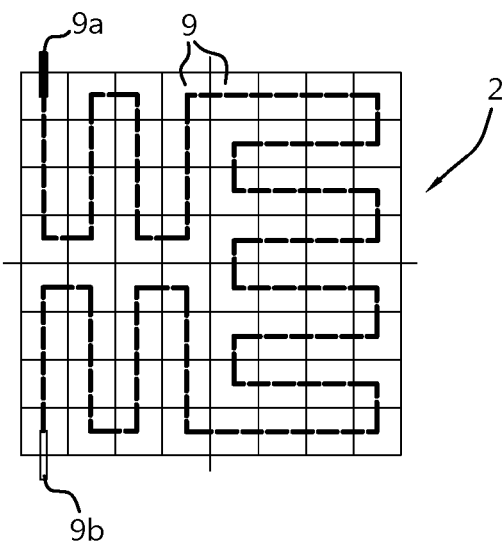

FIG. 3 shows in more detail the configuration of an exemplary sub-module 2 according to the present invention. Again, the parallel connection 3, 4 are shown, as well as the designated areas 7 for these parallel connections. In this embodiment, the sub-module 2 comprises an 8×8 array of cells 9, having back contacts. The series connection of the cells 9 is provided using serial wiring as part of the single back conductive sheet. FIG. 4a shows the meandering pattern (row-by-row) of the cells 9 in this embodiment, with a negative terminal 9a and a positive terminal 9b for each string of n series-connected cells 9. FIG. 4b shows an alternative arrangement for the string of series-connected cells 9, in a pattern with smaller and differently oriented meanders. Even further alternative embodiments are available, especially keeping in mind that when using the parallel connections 3, 4 for the sub-modules 2, the exact attachment position of the positive and negative string terminal can vary. E.g. when using the embodiment of FIG. 2, the connection can be anywhere at the top and bottom row of the series-connected cells 9.

In an exemplary embodiment of the present invention, as the one shown in FIGS. 1 and 2, the photovoltaic module comprises 15 strings (sub-modules 2), each string occupying a square area. The string e.g. comprises 64 cells 9 in an 8×8 array , where 16 cells have been cut out from a square or semi-square wafer of 15.6×15.6 cm$^2$ . Every square-area string represents a modular component of the photovoltaic module 1.

Figure 5A:
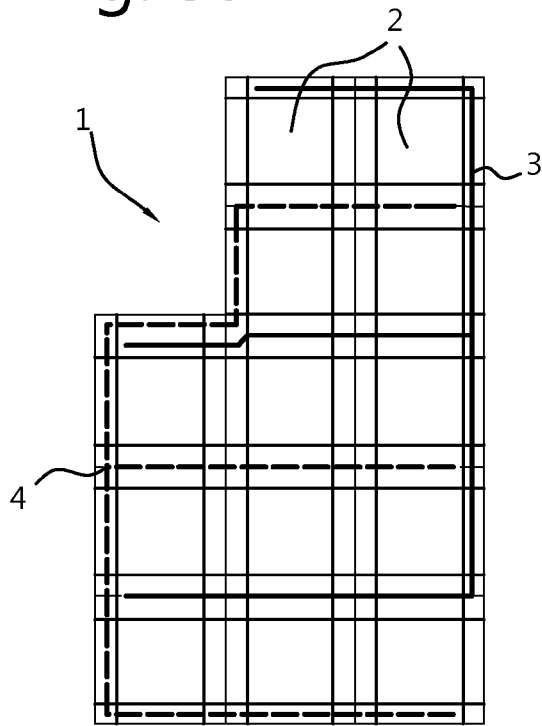
FIG. 5a-5d show embodiments of the photovoltaic module of the present invention having various shapes.
Figure 5B:
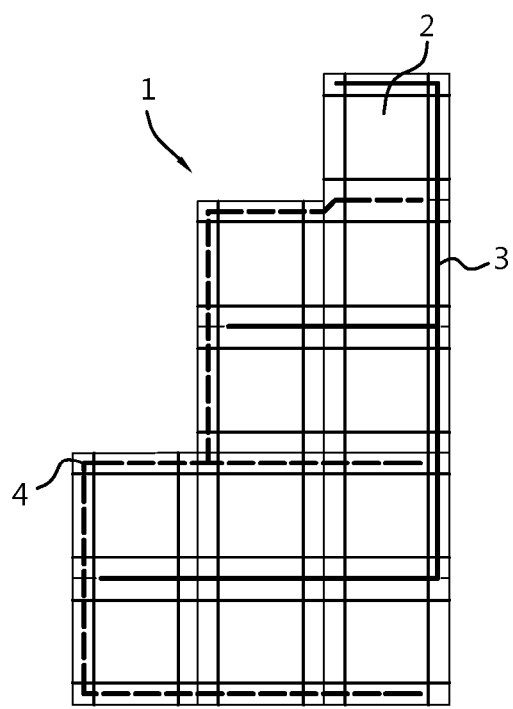
Figure 5C:
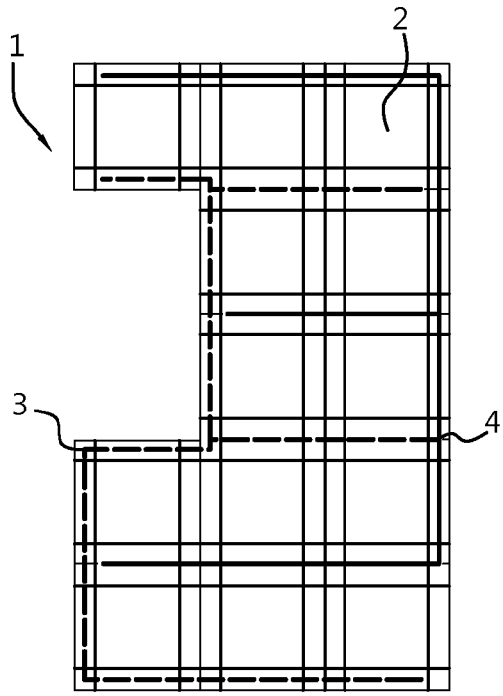
Figure 5D:
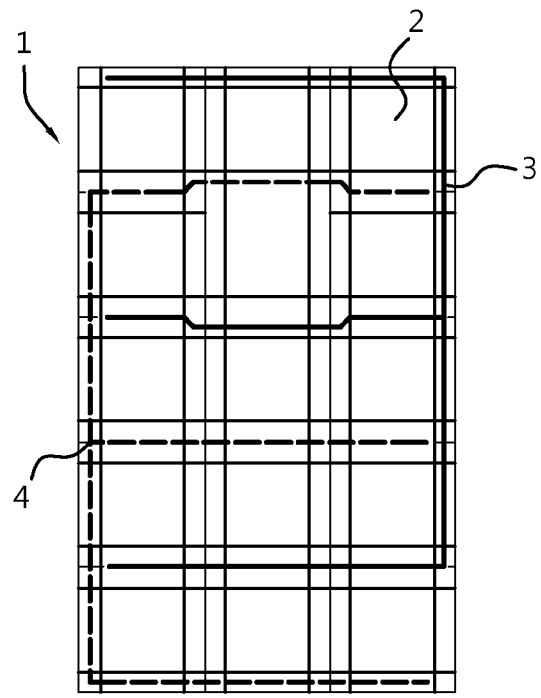

In a further embodiment, the m sub-modules 2 are arranged in an array having a non-rectangular shape. A plurality of photovoltaic module shapes is possible where each square-area string 2 is present or not. This implies that a plurality of photovoltaic module shapes is possible amounting to a number of $2^{15}$. Accounting for rotational and mirror symmetry this number reduces to $2^{13}=8192$ possible photovoltaic module shapes. A number of examples thereof, including amended routing of the parallel connections 3, 4, when necessary, are shown schematically in FIG. 5a-5d. FIG. 5a shows a variant, where the top left two sub-modules 2 have been deleted, resulting in a photovoltaic module 1 with a corner indentation. FIG. 5b shows a variant where multiple sub-modules 2 have been left out, resulting in a stepped form at the left upper corner of the photovoltaic panel. FIG. 5s shows an embodiment where two sub-modules 2 have been left out at the left edge of the photovoltaic module 1, allowing e.g. placement around a building element such as a chimney. FIG. 5d shows an even further embodiment, where one of the sub-modules 2 in the middle have been left out, resulting in a photovoltaic module 1 having an aperture therein. Even further modifications are possible as indicated before, and are not limited to the shapes and embodiments as shown. Note that when using other types of arrays of sub-modules, even further shapes and sizes of the photovoltaic module 1 can be obtained.

In more general terms, a photovoltaic module 1 may be provided having one or more strings of n series-connected cells 9, wherein n is at least 16, e.g. 64. This implies the use of sufficiently small cells as each string comprises 16 or 64 cells, allowing to use the present invention parallel and series configuration obviating the need of bypass diodes. For this, in a further embodiment, a photovoltaic module is provided with m sub-modules 2, wherein m is at least 4, e.g. 15.

It is noted that the individual cells 9 as used in the photovoltaic module may be rectangular in a further embodiment, yet the sub-module 2 formed by that string remains substantially square. An embodiment where the sub-module 2 occupies a square area, but where the sub-module 2 comprises rectangular cells 9 can be provided with the aim to achieve a higher voltage per string and therefore also a higher module voltage. An embodiment with a sub-module 2 occupying a substantially square (i.e. somewhat rectangular area) may be provided, again comprising cells 9 that are rectangular or square. Such an embodiment would realize relatively more bussing along the elongated side of the sub-module 2.

Figure 6:
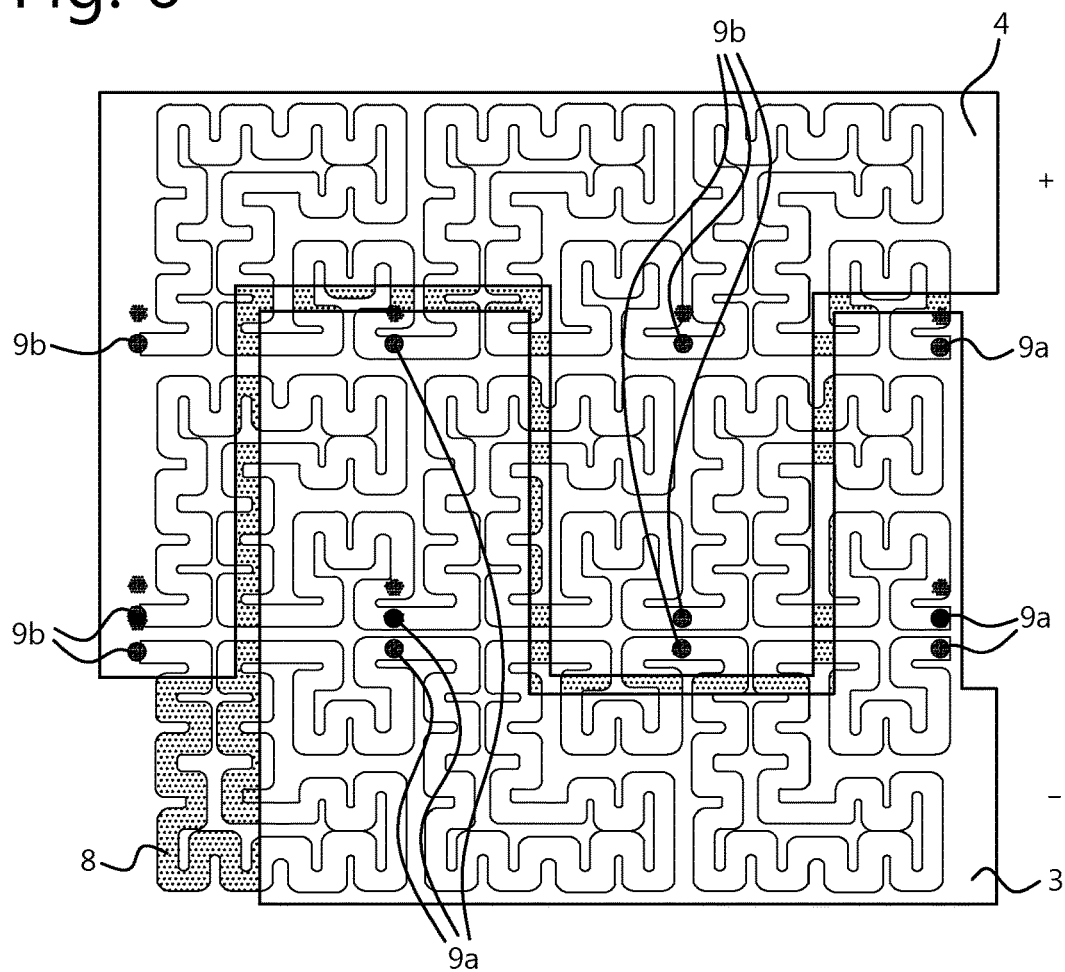
FIG. 6 shows a double foil embodiment of an embodiment of the present invention photovoltaic module.

In a further group of embodiments, the back conductive sheet comprises a first back conductive sheet and a second back conductive sheet, and the parallel connection 3, 4 is provided by the first back conductive sheet and connections 8 for each string of n series-connected back contact cells 9 are provided in the second back conductive sheet. This is shown in the partial photovoltaic module view of FIG. 6. The connections 8 in the form of a fine meandering pattern is shown which forms the second back conductive sheet and interconnects 64 cells 9. Overlying this second back conductive sheet is a first back conductive sheet, isolated from the second back conductive sheet with the exceptions of the terminal ends 9a, 9b of each string of n series-connected cells 9. The first back conductive sheet is thus provided as a kind of interdigitated connection layer, and the second back conductive sheet as a meandering pattern of connections. Of course multiple variations of the orientation and routing of the first and second back conductive sheets are possible, e.g. the interdigitated connection layer (first back conductive sheet) may have tapered conductive leads. In other words, a primary foil (the second back conductive sheet) takes care of the series interconnection and a secondary foil (the first back conductive sheet), isolated from the primary, takes care of the current transport of all sub-modules 2.

Furthermore, an isolation sheet may be provided between the first back conductive sheet and the second back conductive sheet, to ensure proper electrical isolation. In a further embodiment, the first back conductive sheet may be provided with apertures, which e.g. would allow to make an electrical connection between the first and second back conductive sheet using a conductive adhesive or the like. The apertures in the first back conductive sheet may also be used to allow a cell 9 having three contacts to make the relevant electrical connections. E.g. two contacts of a first polarity of the cell 9 contacts the first and second back conductive sheets, and the third contact of the opposite polarity contacts a proper connection, e.g. the meandering conductor 8 of the FIG. 6 embodiment.

In order to further improve the (partial) shading behavior of a photovoltaic cell, a further group of embodiments is provided, wherein the cells 9 are of a type having a low break down voltage Vbd, e.g. Vbd is greater than −8V (Vbd≥−8V, i.e. less than 8 V in absolute sense). In certain types of photovoltaic cells 9 effects or features inherently present in the cell design may be used, e.g. in the case of using Schottky type parasitic diode formation in metal vias of a metal wrap through cell 9. Photovoltaic modules 1 comprising cells 1 with a very low break-down voltages (Vbd) could be used obviating the need of bypass diodes. A low Vbd (in absolute sense) limits the power dissipation in a shaded cell 9, since the power is limited by Vbd×Isc, where Isc is the short-circuit current. Low power dissipation obviously means a reduced temperature increase and therefore less risk of module damage and fire.

When the module is short circuited and one cell of cells 9 is shaded and this cell 9 is part of a sub-module of 64 cells 9, the 63 unshaded cells 9 will typically provide a voltage of 63×0.6V≈38 V, while the shaded cell 9 will be operated at the same voltage, but then in a negative sense, i.e. −38V, yielding in total 0V. In that case the power dissipation will be maximally 16 W (38V times a typical short circuit current, Isc, of 0.5 A) in the shaded cell 9. If this occurs in a so-called hot spot this will lead to a high temperature increase locally and may cause irreversible damage to the cell 9. In order to prevent this situation a bypass diode 12 over a subset of cells 9 that include the shaded cell 9 will prevent this situation. To prevent damage under these circumstances, bypass diodes 12 can yet be useful. This holds for the situation that the (shaded) cell 9 has a very high break-down voltage in absolute sense (Vbd<−38V). If the shaded cell 9 has a lower breakdown, in absolute sense, i.e. Vbd>−38V the power dissipation is limited by Vbd× Isc=Vbd×0.5. If the absolute value of Vbd is small enough and hence the product Vbd×Isc then bypass diodes 12 can be left out.

In a further group of embodiments, bypass diodes are used to provide an even better performance with regard to partial shading. In this group of embodiments, each string comprises two or more sub-strings 11, and bypass diodes 12 are connected parallel to each of the two or more sub-strings 11. This is shown in the schematic view of FIG. 7, where the electronic equivalents are shown for each of the 15 sub-modules 2 (strings 1 . . . 15). Each string comprises four sub-strings 11, and each of the sub-strings 11 are parallel shunted by a bypass diode 12. Each sub-string 11 e.g. comprises a series-connection of 16 (small) cells 9, and as a result each string 2 comprises four sub-strings 11 with a total of 64 cells 9. In case of partial shading the effects are mitigated because of the four bypass diodes 12. The bypass diodes 12 may be embodied as a surface mount device (SMD) type, which would even allow to position the bypass diodes 12 on the back conductive sheet (or conductive back sheet), even e.g. in between cells 9. The bypass diodes 12 in this embodiment only need to have a small capacity, as only 16 small cells 9 are bridged, and thus allow easy incorporation in a laminated layer. As an alternative, flat wafer based bypass diodes 12 can be utilized, which are also easy to integrate in the photovoltaic module 1 design.

Above, multiple embodiments of the present invention photovoltaic module have been described, which all exhibit improvements over conventional types of photovoltaic modules.

Conventional modules have three strings connected in series, where each string has a bypass diode. These modules have non-optimal shade behavior. Shading one cell will take down one entire string, i.e. one third of the photovoltaic panel. Horizontal shading of, say, 6 cells in a row distributed over three strings will take down practically the entire module. Moreover, the area that the string occupies is elongated which makes the module vulnerable to shades that have its elongation perpendicular to the elongated string-area. Also, the bypass diodes are adding to the costs of the module. In addition, the bypass diodes need to be accommodated in a bypass diode box (junction box). This box is in common practice placed on the rear-side of the module which brings about limitations of module applications, e.g. flat, in-roof mounting is hampered by the size of the bypass diode box.

As explained above, this invention is a solution for a bypass diode free module with a much better shading response than conventional PV panels. This can be attributed to the parallel connection of multiple strings. The PV panel response is much more proportional to the illumination fraction than conventional modules.

Incorporating more than the conventional three bypass diodes is an alternative solution. However, the difficulty then is that it is increasingly difficult to accommodate all these bypass diodes in a bypass diode box or boxes. This would require a vast amount of conductive leads (bussing) towards the bypass diode box(es). Moreover the number of bypass diodes is limited due to the topology of the bussing (crossovers of bussing and tabbing is cumbersome and would require bus-tab isolation and bigger cell spacing).

As explained above, in a specific group of present invention embodiment, bypass diodes can be laminated together with the photovoltaic cells. In conventional photovoltaic modules, due to the size of conventional bypass diodes, that are able to carry 9A, this brings about lamination difficulties (stress/tension) and adds to the cost of the photovoltaic module. In the specific group of present invention embodiments this can be prevented, as a large number of smaller capacity (which also have smaller dimensions) bypass diodes 12 may be used.

In general, the present invention embodiments can be characterized as having a parallel connection of strings of (small) back-contact solar cells 9 where the parallel conductors 3, 4 and the series connection conductors 8 are integrated in a conductive foil, and where the parallel conductors 3, 4 are behind the solar cells 9, and where the structure of the PV panel is modular.

The benefits are lower cost due to the absence of bypass diodes, made possible by parallel interconnection and better shade performance. Moreover, the modular design of the photovoltaic module 1 allows all kinds of module shapes. This enables the coverage of roofs with different panel shapes (L-shape, U-shapes, O-shapes, etc) and allowing positioning nearby/around obstacles like chimneys. Obviously, this greatly enhances the freedom in roof coverage and leads to improved building aesthetics. Nowadays, often dummy modules are used to fill roofs (or other areas) for aesthetical purposes, however, these do not produce power. The present invention allows more, and more efficient, power production from such roofs. The architecture of the present invention photovoltaic modules 1 can be tuned for a standardized voltage (e.g. 32 V), regardless of a module 1 shape or size, enabling DC-DC converters or micro-inverters optimized for this particular voltage.

It is noted that the cells 9 can be mounted on the back conductive sheet in a manner known as such, e.g. using a conductive material like solder, conductive adhesive, etc (see also the patent application PCT/NL2013/050819 of the present applicant, not yet published). It would be possible to use a pick and place robot with a vision system to position and place the cells 9 onto the back conductive sheet. A PV module can then be assembled by starting with a back sheet (e.g. PET), possibly provided with an outer layer of PVF. The back conductive sheet can be formed as a foil (e.g. using Cu, Al, or Al with cold-sprayed Cu spots) with possibly an isolation coating (e.g. organic surface protection layer or a Zinc Chromate layer), with opened (bare metal) spots on which conductive material dots are applied, like conductive adhesive or solder, followed by applying an encapsulant material with openings (e.g. perforated EVA). The cells 9 can then be positioned on the conductive material dots, and an additional encapsulant material (e.g. EVA) is applied, followed by a transparent cover slab (e.g. glass).

The application area will be Building Applied PV (BAPV) and Building Integrated PV (BIPV) market. The invention results in shade-tolerant PV appliances and design freedom for PV systems on roofs.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. A photovoltaic module comprising a negative terminal and a positive terminal, a parallel connection of m sub-modules connected to the negative and the positive terminals of the photovoltaic module, and a single back conductive sheet, wherein each of the m sub-modules comprises a string of n series-connected back-contact cells, wherein the n cells of each sub-module are arranged in an array, and wherein the single back conductive sheet forms:

the parallel connection between the m sub-modules connected to the negative and positive terminals of the photovoltaic module, and the series connection between each of the n series-connected back contact cells in each string, and wherein the single back conductive sheet comprises designated areas for the parallel connection, corresponding to edge parts of each corresponding sub-module, wherein the connections in the single back conductive sheet are formed using isolation scribes, and wherein the area of a sub-module corresponds to an area of the cells comprised in a sub-module.

2. A photovoltaic module according to claim 1, wherein each sub-module has a substantially square footprint.

3. A photovoltaic module according to claim 1, wherein n is at least 16.

4. A photovoltaic module according to claim 1, wherein m is at least 4.

5. A photovoltaic module according to claim 1, wherein the parallel connection comprises an interdigitated connection of the sub-modules.

6. A photovoltaic module according to claim 1, wherein the cells are rectangular.

7. A photovoltaic module according to claim 1, wherein the photovoltaic module comprises a 3×5 array of sub-modules.

8. A photovoltaic module according to claim 1, wherein each sub-module comprises an 8×8 array of series connected cells.

9. A photovoltaic module according to claim 1, wherein each sub-module comprises four sub-arrays of 4×4 cells originating from a single wafer.

10. A photovoltaic module according to claim 1, wherein the cells are of a type having a low break down voltage Vbd, e.g. Vbd≥−8V.

11. A photovoltaic module according to claim 1, wherein each string comprises two or more sub-strings, and bypass diodes are connected parallel to each of the two or more sub-strings.

12. A photovoltaic module according to claim 11, wherein the bypass diodes are of a surface mount device type.

13. A photovoltaic module according to claim 1, wherein the m sub-modules are arranged in an array having a non-rectangular shape.

14. A photovoltaic module according to claim 1, wherein the series connections of the cells in the single back conductive sheet are provided as islands in conductive material that forms the parallel connections in the single back conductive sheet.

15. A photovoltaic module according to claim 14, wherein the islands are formed as insulated wiring islands.

16. A photovoltaic module according to claim 14, wherein the single back conductive sheet is divided into a positive section and a negative section forming the respective parallel connections isolated from each other by an isolation scribe, and wherein each of the m sub-modules is overlapped by a portion of the positive section and a portion of the negative section.

17. A photovoltaic module according to claim 1, wherein each of the n series-connected back contact cells is provided with three terminals, wherein:
 a first terminal is provided in a first corner of the cell,
 a second terminal is provided in a second corner diagonally opposite the first corner, and
 a third terminal is disposed between the first and second terminals, and
 wherein, for each cell, the first and second terminals have an opposite polarity to the third terminal.

18. A photovoltaic module according to claim 1, wherein the cells are sized such that 16 cells can be cut from a wafer of 15.6×15.6 cm.

* * * * *